United States Patent
Goruganthu et al.

(10) Patent No.: US 6,391,664 B1
(45) Date of Patent: May 21, 2002

(54) SELECTIVELY ACTIVATABLE SOLAR CELLS FOR INTEGRATED CIRCUIT ANALYSIS

(75) Inventors: Rama R. Goruganthu; Jeffrey D. Birdsley; Michael R. Bruce; Brennan V. Davis; Rosalinda M. Ring, all of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/409,302

(22) Filed: Sep. 29, 1999

(51) Int. Cl.$^7$ ................................................. H01L 21/00
(52) U.S. Cl. ........................... 438/14; 438/10; 438/19; 438/200
(58) Field of Search ........................... 438/14, 15, 16, 438/17, 18, 19, 5, 7, 96, 97, 200

(56) References Cited

U.S. PATENT DOCUMENTS

| | | | |
|---|---|---|---|
| 4,296,331 A | * | 10/1981 | Rodriguez |
| 4,416,054 A | * | 11/1983 | Thomas |
| 4,759,803 A | * | 7/1988 | Cohen |
| 5,196,374 A | * | 3/1993 | Hundt et al. |
| 5,460,659 A | * | 10/1995 | Krut |
| 5,549,762 A | * | 8/1996 | Cantarini |

* cited by examiner

*Primary Examiner*—Savitri Mulpuri

(57) ABSTRACT

An integrated circuit manufacturing approach involves using a solar cell and facilitating post-manufacturing analysis. According to an example embodiment of the present invention, a solar cell is formed in an integrated circuit device and coupled to target circuitry in the device. The solar cell is activated and provides power to the target circuitry. In response to the solar cell providing power to the target circuitry, the integrated circuit is analyzed.

19 Claims, 5 Drawing Sheets

SELECTIVELY ACTIVATABLE SOLAR CELLS FOR INTEGRATED CIRCUIT ANALYSIS

FIELD OF THE INVENTION

The present invention is exemplified in a number of implementations and applications, some of which are summarized below. In connection with the post-manufacturing analysis of integrated circuit devices, one aspect the present invention provides is a new and useful method involving the use of a solar cell for selectively activating circuitry in an integrated circuit device.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors, operating at speeds of hundreds of millions of instructions per second to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

As the manufacturing processes for semiconductor devices and integrated circuits increase in difficulty, methods for testing and debugging these devices become increasingly important. Not only is it important to ensure that individual chips are functional, it is also important to ensure that batches of chips perform consistently. In addition, the ability to detect a defective manufacturing process early is helpful for reducing the number of defective devices manufactured.

Traditionally, integrated circuits have been tested using methods including directly accessing circuitry or devices within the integrated circuit. In addition, many methods require the circuit to be powered. Directly accessing the circuitry is difficult for several reasons. For instance, in flip-chip type dies, transistors and other circuitry are located in a very thin epitaxially-grown silicon layer in a circuit side of the die. The circuit side of the die is arranged face-down on a package substrate. This orientation provides many operational advantages. However, due to the face-down orientation of the circuit side of the die, the transistors and other circuitry near the circuit side are not readily accessible for testing, modification, or other purposes. Therefore, access to the transistors and circuitry near the circuit side is from the back side of the chip.

Since access to the transistors and circuitry in flip-chips is generally from the back side of the device, it is often necessary to mill through the back side and probe certain circuit elements in order to test the device. Milling through the back side is often difficult and time consuming, and circuitry and devices in the integrated circuit may potentially be damaged by milling processes. In addition, for flip-chips and other integrated circuit devices, it is difficult to access and selectively activate circuitry within the device. The difficulty, cost, and destructive aspects of existing methods for analyzing integrated circuits are impediments to the growth and improvement of semiconductor technologies.

SUMMARY OF THE INVENTION

The present invention is exemplified in a number of implementations and applications, some of which are summarized below. In connection with the post-manufacturing analysis of integrated circuit devices, one aspect the present invention provides is a new and useful method involving the use of a solar cell for selectively activating circuitry in an integrated circuit device.

According to an example embodiment of the present invention, a solar cell is formed in an integrated circuit device. The solar cell is coupled to target circuitry to be powered. The solar cell is activated, power is supplied to the target circuitry, and the integrated circuit is analyzed in response to the powered target circuitry.

According to another example embodiment of the present invention, a system is arranged for analyzing an integrated circuit device having circuitry in a front side opposite a back side, and having a solar cell formed in the integrated circuit device. Light is directed to the solar cell and current is generated. The current is used to provide power to circuitry in the cell. In response to the powered circuitry, the integrated circuit is analyzed.

The above summary of the present invention is not necessarily intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
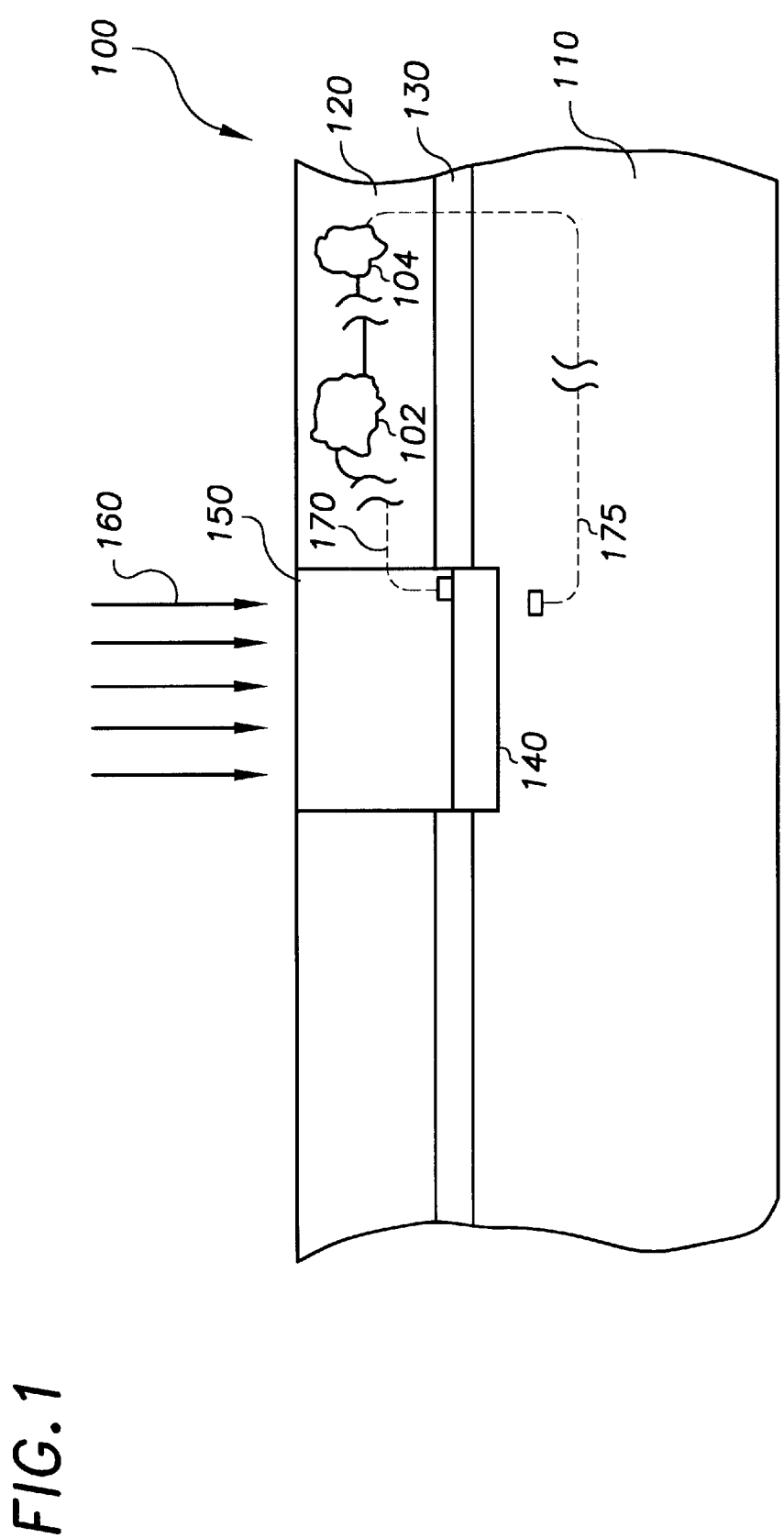
FIG. 1 shows an integrated circuit device having a solar cell, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives failing within the spirit and scope of the invention as defined by the appended claims.

DETAILED DESCRIPTION

The present invention is believed to be applicable to a variety of different types of integrated circuit devices requiring or benefiting from post-manufacturing analysis of device circuitry. The invention has been found to be particularly useful in connection with flip-chip dies and other integrated circuit types having a region in which solar cells can be readily formed and coupled to other circuitry in the die. While the present invention is not necessarily limited to such devices, various aspects of the invention may be appreciated through a discussion of various examples using this context.

According to an example embodiment of the present invention, FIG. 1 shows an integrated circuit device 100 having a solar cell formed within the device. The solar cell is used to activate target circuitry such as circuitry 102 and 104. When the device 100 is arranged in a test fixture, the target circuitry 102 and 104 can be electrically coupled to input/output lines and analyzed via the input/output lines. For example, the solar cell can be used to supply current to target circuitry 102, which can be analyzed. Alternatively, the target circuitry 102 can be powered via the solar cell and used to drive target circuitry 104.

In a more particular example implementation of the present invention, an epitaxial silicon layer 130 having p-type material is formed over bulk silicon 110. A circuit layer 120 is formed over the episilicon layer 130. A portion of the device 140 is doped with n-type material. Although the n-doped portion 140 is representatively shown extending into the bulk silicon, the n-doped portion 140 may be arranged in other orientations, such as within the episilicon layer 130, over the episilicon layer 130, and in the circuit layer 120. A p-n junction between the n-doped portion 140 and p-doped silicon forms a solar cell. A window layer 150 is formed over the n-doped portion 140. The window layer may, for example, include a dielectric or other material that allows light to pass through.

Once the solar cell is formed, the integrated circuit device is packaged such that the solar cell is unexposed to light, such as in conventional die packaging for a flip-chip, having generally opaque substrate formed over the window or otherwise over the solar cell, or packaged in an outer housing of a product, such as that of a handset of a phone or an enclosure for a computer.

When analysis is to be performed on the integrated circuit, a light beam 160 is directed at the n-doped portion 140 via the window layer 150 and generates carriers that collect in the depletion region of the p-n junction. Various light sources can be used to generate the carriers, such as a source that generates light having a photon energy greater than the band gap energy, or a laser light device having a wavelength of about 1064 nanometers.

The carriers make electron-hole pairs that generate sufficient current to drive target circuitry coupled to the junction. Contact 170 is coupled to the n-doped portion 140 of the solar cell and contact 175 is coupled to a p-doped portion of the integrated circuit device. The leads from contacts 170 and 175 are coupled to excite target circuitry within the device, and the current generated at the p-n junction flows to the target circuitry. With the target circuitry selectively activated in this manner, the integrated circuit can be analyzed with selective control over the target circuitry 102 and 104.

Figure 2:
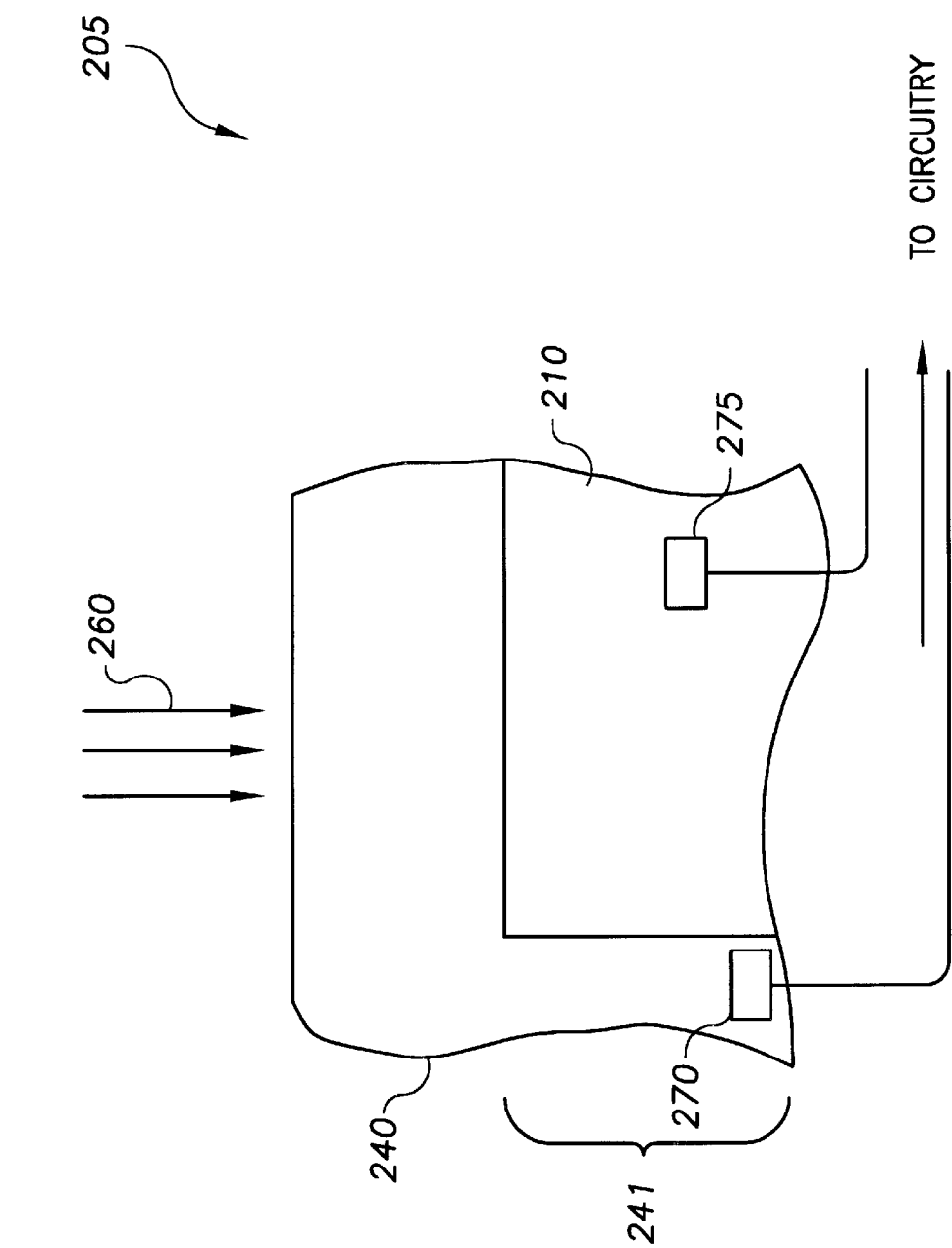
FIG. 2 shows a portion of substrate used to form a solar cell, according to another example embodiment of the present invention.

FIG. 2 shows another method in which to couple leads to the solar cell, according to a more particular example embodiment of the present invention. A portion 205 of an integrated circuit has p-type material 210 and n-type material 240 forming a p-n junction that is used to form a solar cell. A portion 241 of the n-type material 240 extends into the p-type material 210. A contact 270 is coupled to the n-type material 240 via portion 241. Contact 275 is coupled to a portion of the p-type material 210. The leads from the contacts 270 and 275 are coupled to circuitry within the integrated circuit. Light 260 is directed at the n-type material to generate current in the solar cell. The current is supplied to circuitry coupled via contacts 270 and 275. By using the extended n-type portion 241, the contacts 270 and 275 can be located on the same side of the solar cell.

Figure 3:
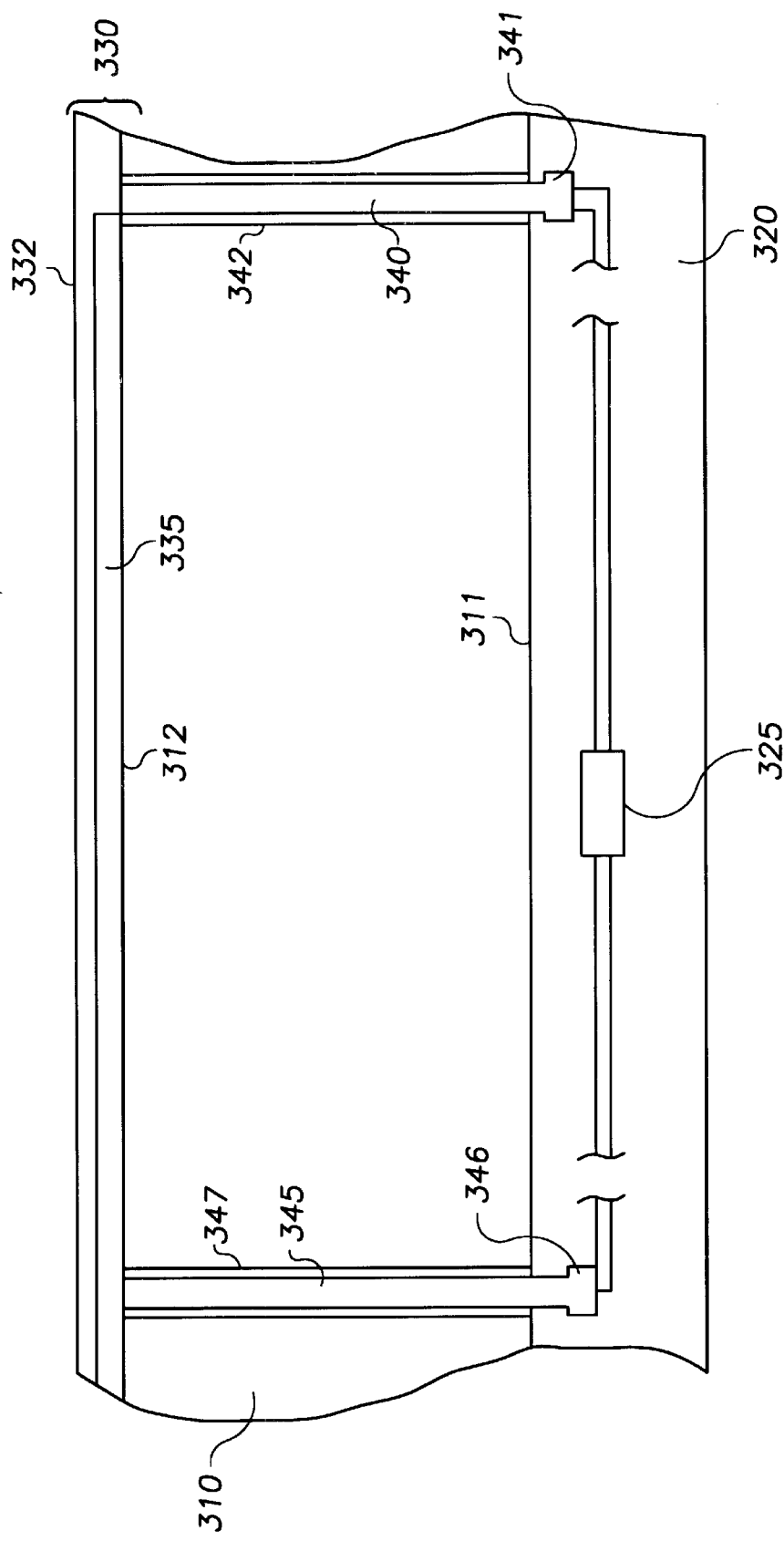
FIG. 3 shows an integrated circuit device having a solar cell formed on the back side of the device, according to another example embodiment of the present invention.

FIG. 3 shows another example embodiment of the present invention in which a solar cell is used to activate circuitry in an integrated circuit device. Bulk silicon 310 is formed having a front side surface 311 and a back side surface 312. Metal vias 340 and 345 are formed in the bulk silicon 310. The front side surface 311 is polished and circuitry 325 is formed in a circuit side 320 on the front side of the bulk silicon 310. A portion of the circuitry 325 is coupled to the metal vias 340 and 345. The back side surface 312 is polished and p-doped episilicon material 335 is deposited over the polished back side of the bulk silicon 310, and n-doped material 332 is deposited over the p-doped material 335. In a more particular implementation, the solar cell 330 includes amorphous silicon. The resulting p-n junction is used as a solar cell 330. The p-type material 335 is coupled to via 345, and the n-type material 332 is coupled to via 340. The solar cell 330 is activated and the integrated circuit is analyzed.

The metal vias 340 and 345 may be formed using various methods. According to a more particular example embodiment of the present invention, the metal vias 340 and 345 are formed by first milling through the bulk silicon 310 and forming a hole. Insulating layers 342 and 347 are formed on the inside surface of the holes using materials such as an oxide. Metal is deposited in the holes to form the vias 340 and 345. For a more detailed explanation of an example method for forming insulating material useful for the formation of vias, reference may be made to U.S. patent application Ser. No. 09/383,790, filed on Aug. 26, 1999 and entitled "ARRANGEMENT AND METHOD FOR CHARACTERIZATION OF FIB INSULATOR DEPOSITION." The vias can be coupled to a solar cell formed over the back side, such as shown in FIG. 3, or can be coupled to solar cells formed by other methods such as by bonding a solar cell to the back side 312. The vias can also be coupled to various circuitry within the device, such as representative circuitry 325.

Figure 4:
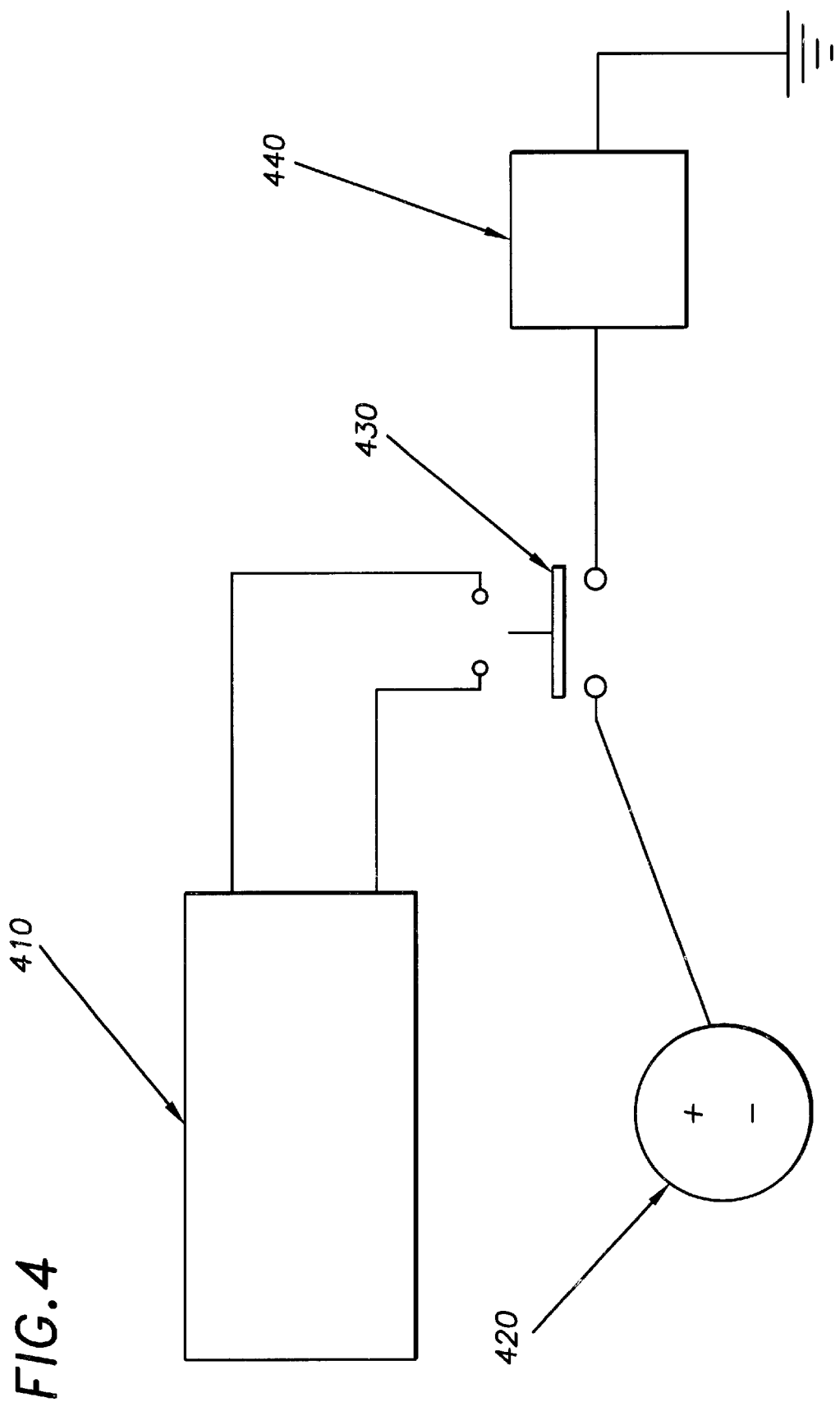
FIG. 4 is a schematic representation of a circuit in an integrated circuit device, according to another example embodiment of the present invention.

The solar cells of the present invention can be coupled to circuitry and used in various manners. According to one example embodiment of the present invention, FIG. 4 shows a schematic circuit diagram for coupling a solar cell to circuitry within an integrated circuit device. Solar cell 410 is coupled to a switch 430. When light incident upon the solar cell 410 generates current, that current activates the switch 430. Power source 420 is coupled to device circuitry 440 via the switch 430. When light is directed at the solar cell 410, current flows and activates the switch 430, closing the circuit between the power source 420 and powering the device circuitry 440. For instance, the power source 420 can be used to input signals to the device circuitry 440. In this manner, the power supply to portions of circuitry in the integrated circuit device can be easily controlled and used for post-manufacturing analysis.

Figure 5:
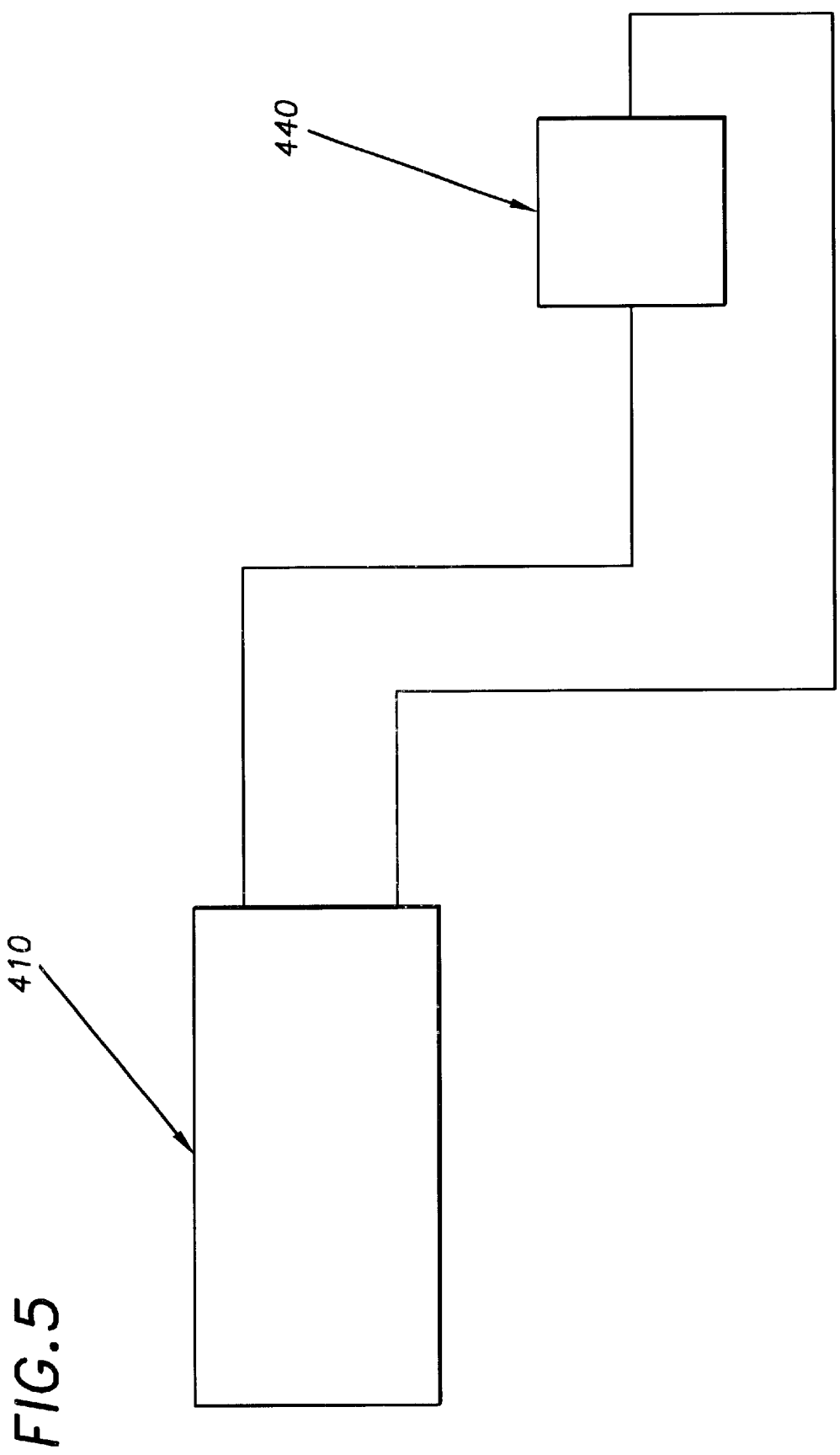
FIG. 5 is another schematic representation of a circuit in an integrated circuit device, according to another example embodiment of the present invention.

FIG. 5 shows another schematic circuit diagram for coupling the solar cells described herein to activate selected circuitry in an integrated circuit device, according to another example embodiment of the present invention. A solar cell 410 is coupled to target circuitry 440 for analysis in an integrated circuit device. When light is directed at the solar cell 410, power is supplied directly via the solar cell to the circuitry 440. This is useful for activating portions of circuitry within an integrated circuit device without necessarily having to couple the device to a power source, such as shown in FIG. 4. In addition, the schematics shown in FIG. 4 and FIG. 5 can be used in combination within an integrated circuit device for powering or controlling the power to circuitry 440 in the device. Several solar cells can be formed in various portions of the device and used to activate selected circuitry throughout the device.

Using a solar cell to directly supply power to circuitry, such as shown in FIG. 5, is useful in several applications. For example, the circuitry 440 may include target circuitry suspected of being defective. The suspicion may be based on other analysis performed on the device, or based on a history of defects in similar integrated circuit devices or in a similar production run of devices. Using the solar cell, the target circuitry can be analyzed. The circuitry 440 may also include intervening circuitry arranged to drive other circuitry for which analysis is desired, based on a suspected defect, history, or other basis. The solar cell can be used to activate the intervening circuitry, which in turns drives other circuitry that can be analyzed.

While the present invention has been described with reference to several particular example embodiments, those skilled in the art will recognize that many changes may be made thereto without departing from the spirit and scope of the present invention, which is set forth in the following claims.

What is claimed is:

1. A method of manufacturing an integrated circuit device having target circuitry and of facilitating post-manufacturing analysis of the integrated circuit device, the method comprising:

forming a solar cell in the integrated circuit device;

coupling the solar cell to the target circuitry, wherein in response to light, the solar cell couples current to the target circuitry; and packaging the integrated circuit and arranging the solar cell to be maintained unexposed to light, wherein during post-manufacturing analysis, the integrated circuit is accessed and the solar cell is exposed to light for analyzing the integrated circuit.

2. The method of claim 1, wherein analyzing the integrated circuit includes analyzing the target circuitry.

3. The method of claim 1, wherein the target circuitry includes at least one of: a switch, suspect circuitry, and intervening circuitry arranged to drive circuitry to be analyzed.

4. The method of claim 1, wherein the integrated circuit is activated in response to input signals that are coupled to circuitry powered by the solar cell.

5. The method of claim 1, wherein the integrated circuit is part of a device having a back side opposite circuitry in a circuit side, wherein the solar cell is formed in the back side.

6. The method of claim 1, wherein the integrated circuit is part of a device having a back side opposite circuitry in a circuit side, and wherein the solar cell is formed in the circuit side.

7. The method of claim 1, wherein activating the solar cell includes directing light having photon energy greater than the band gap energy at the solar cell.

8. The method of claim 1, wherein activating the solar cell includes activating the target circuitry coupled to the solar cell.

9. The method of claim 1, wherein the target circuitry coupled to the solar cell includes a switch coupled to a power supply and other circuitry in the integrated circuit, and wherein activating the solar cell includes activating the switch and controlling the power supplied to the other circuitry in the integrated circuit via activating the switch.

10. The method of claim 1, wherein coupling the solar cell to target circuitry comprises forming vias in the integrated circuit device.

11. The method of claim 1, further comprising forming a contact in the integrated circuit device arranged for coupling the solar cell to the target circuitry.

12. The method of claim 1, wherein forming at least one solar cell comprises:

forming a n-doped region in the semiconductor device; and forming a p-doped region in the n-doped region, wherein the p-doped region covers about all of one side of the n-doped region except a n-doped contact portion.

13. The method of claim 1, wherein activating at least one solar cell comprises:

directing light having a wavelength of about 1064 nanometers at the solar cell;

generating carriers in a depletion region at a p-n junction and creating electron-hole pairs; and powering the device.

14. A method for manufacturing an integrated circuit device and facilitating post-manufacturing analysis, the method comprising:

forming bulk silicon having a front side and a back side;

forming a metal via in the bulk silicon;

polishing the front side of the bulk silicon;

forming a circuit layer having target circuitry on the polished front side of the bulk silicon and coupling the target circuitry to the metal via;

polishing the back side of the bulk silicon;

forming epitaxial silicon on the polished back side of the bulk silicon; and forming a solar cell on the back side of the bulk silicon and coupling the solar cell to the metal via to facilitate activation of the target circuitry and analysis of the integrated circuit device.

15. The method of claim 14, wherein forming a solar cell on the back side of the bulk silicon comprises:

forming p-doped epitaxial silicon on the back side; and forming an n-doped region over the p-doped epitaxial silicon.

16. The method of claim 15, wherein the epitaxial silicon includes amorphous silicon.

17. The method of claim 14, wherein forming a solar cell comprises bonding the solar cell to the back side of the bulk silicon.

18. The method of claim 14, wherein forming a solar cell includes forming a solar cell over about all of the back side of the bulk silicon.

19. The method of claim 14, wherein forming a metal via in the bulk silicon comprises:

milling the bulk silicon and forming a hole;

forming an insulative layer on the inside surface of the hole; and forming a metal via in the insulated hole.

* * * * *